United States Patent
Habuka

[19]

[11] Patent Number: 5,868,833
[45] Date of Patent: Feb. 9, 1999

[54] METHOD OF PRODUCING SILICON SINGLE CRYSTAL THIN FILM

[75] Inventor: Hitoshi Habuka, Maebashi, Japan

[73] Assignee: Shin-Etsu Handotai Co., Ltd., Tokyo, Japan

[21] Appl. No.: 802,107

[22] Filed: Feb. 19, 1997

[30] Foreign Application Priority Data

Mar. 4, 1996 [JP] Japan .................................. 8-045722

[51] Int. Cl.⁶ .................................................. C30B 25/02
[52] U.S. Cl. ..................................... 117/84; 90/93; 90/97
[58] Field of Search ................................ 117/84, 90, 93, 117/97

[56] References Cited

U.S. PATENT DOCUMENTS

| | | | |
|---|---|---|---|
| 3,200,001 | 8/1965 | Merkel et al. ............................ | 117/97 |
| 3,341,374 | 9/1967 | Sirtl .......................................... | 117/97 |
| 3,945,864 | 3/1976 | Goldsmith et al. ....................... | 117/97 |

FOREIGN PATENT DOCUMENTS

| | | |
|---|---|---|
| 0731492 | 9/1996 | European Pat. Off. . |
| 998942 | 7/1965 | United Kingdom . |
| 1071412 | 6/1967 | United Kingdom . |

OTHER PUBLICATIONS

H. Habuka et al., "Numerical Evaluation of Silicon–Thin Film Growth from $SiHCl_3$–$H_2$ Gas Mixture in a Horizontal Chemical Vapor Deposition Reactor", *Japanese Journal of Applied Physics*, vol. 33, No. 4A, Apr. 1994, pp. 1977–1985.

H. Habuka et al., "Modeling of Expitaxial Silicon Thin–Film Growth on a Rotating Substrate in a Horizontal Single–Wafer Reactor", *Journal of the Electrochemical Society*, vol. 142, No. 12, Dec. 1, 1995, pp. 4272–4278.

*Primary Examiner*—Felisa Garrett
*Attorney, Agent, or Firm*—Oliff & Berridge, PLC

[57] ABSTRACT

A method of producing a silicon single crystal thin film having a smooth surface in a stable manner in vapor-phase growth. A silicon single crystal thin film is grown by mixing silicon chloride raw material with hydrogen gas to form a process gas and supplying the process gas to a semiconductor single crystal substrate at a growth temperature, wherein the thin film is grown at a growth rate equal to or higher than 80% of the maximum growth rate at the growth temperature.

5 Claims, 3 Drawing Sheets

SURFACE OF SILICON SINGLE CRYSTAL

METHOD OF PRODUCING SILICON SINGLE CRYSTAL THIN FILM

BACKGROUND OF THE INVENTION

1. Field of the Invention

Present invention relates to a method of producing a silicon single crystal thin film on a semiconductor single crystal substrate in vapor-phase growth.

2. Related Art

An apparatus shown in FIG. 2, for example, is generally used for performing a method of producing a silicon single crystal thin film (hereinafter simply referred to as a thin film) on a semiconductor single crystal substrate (hereinafter simply referred to as a substrate) in vapor-phase growth.

In the figure, a vapor-phase growth apparatus 10 has a transparent quartz glass vessel 16 with a gas supply port 14 and a gas exhaust port 15 both opening in the vessel 16. The substrate 11 is placed on a susceptor 12 inside the quartz glass vessel 16.

The substrate 11 rotates on a rotary shaft 13, while it is heated by radiation heating means 18 mounted above and below the quartz glass vessel 16. After the substrate 11 is heated up to a temperature, at which a thin film is grown on the substrate in a satisfactory manner, for example of 800° C. to 1200° C., a process gas 20 comprising a carrier gas and a reactant raw material gas is fed to a main surface of the substrate 11 and thereby the thin film is grown on the main surface of the substrate 11 by a chemical reaction of the process gas 20.

It has been known that fine peaks and valleys are sometimes presence to on a surface of a silicon single crystal thin film in vapor-phase growth of the thin film and that the peaks and valleys are more amplified in size as the thickness of the thin film increases. No clear cause for the phenomena of amplification, however, has been known. An estimation has been accepted that a surface of a thin film would be oxidized by water molecules and the oxidized surface would be then reduced by hydrogen gas to create fine pits on the surface of the thin film, in the presence of water inside the vapor-phase growth apparatus for producing the thin film. Because of the inevitable presence of water, investigation through experiments on any imaginable causes other than the presence of water has not been able to be performed. It has been also known from experiences that the surface condition of the thin film varies between very smooth and very poor even in an ambient of a constant water concentration. As described above, because of no clear knowledge about causes and a creation mechanism of the peaks and valleys, a smooth surface of a silicon single crystal thin film has not been produced in vapor-phase growth in a stable manner.

The inventor has made extensive research on a chemical reaction for growing a silicon single crystal thin film. The following are findings, insights from and knowledge related to the findings. Silicon chloride raw material mixed with hydrogen gas is very often used when silicon single crystal thin films are industrially produced.

When any one of silicon chlorides for industrial usage is used, usually silicon tetrachloride ($SiCl_4$), trichlorosilane ($SiHCl_3$) or dichlorosilane ($SiH_2Cl_2$), hydrogen chloride is generated as a by-product. Hydrogen chloride has a corrosive character as is well known, and a surface of a thin film grown is subject to corrosion by the hydrogen chloride gas.

The inventor of the present invention has studied about a way to use silicon chloride raw materials, since the materials are safer in handling compared with silane ($SiH_4$) in light of the safety in handling, it is more advantageous to use silicon chlorides as the raw material if the corrosive character of the materials can be suppressed sufficiently.

According to the law of mass action, which is one of the fundamental rules in chemistry, it should be effective to suppress the corrosive action of hydrogen gas by making decomposition products of silicon chloride raw material generated together with hydrogen chloride to absorb onto the surface of the thin film. Based on these insights and knowledge, the inventor has reached to an idea as set forth below.

When trichlorosilane as an example of silicon chloride is used in a growth reaction of a silicon single crystal thin film, $SiCl$ and/or $SiCl_2$ is generated and adsorbed on the surface of the thin film, while hydrogen chloride is liberated, wherein trichlorosilane ($SiHCl_3$) is decomposed in the vicinity of the surface, as illustratively shown in FIG. 3.

It would be reasonably accepted that the corrosive reaction of hydrogen chloride with a thin film is suppressed if $SiCl$ and/or $SiCl_2$ is adsorbed on the surface of the thin film, since hydrogen chloride reacts with $SiCl$ and $SiCl_2$ so as to give a priority on a reverse reaction of decomposition. In order to make $SiCl$ and/or $SiCl_2$ adsorbed on the surface of the thin film sufficiently, a growth rate has to be large enough by supplying silicon chloride raw material abundantly.

SUMMARY OF THE INVENTION

The inventor has made the present invention as the results of research additionally conducted based on the above mentioned findings from experiments, insights and knowledge of the inventor's.

It is an object of the present invention to provide a method of producing a silicon single crystal thin film, wherein a smooth surface of the thin film is obtainable in a stable manner.

The present invention is directed to a method of producing a silicon single crystal thin film on a semiconductor single crystal substrate in vapor-phase growth which comprises the steps of: mixing silicon chloride raw material with hydrogen ($H_2$) gas to form a process gas; and supplying the process gas to a semiconductor single crystal substrate at a growth temperature, wherein the thin film is grown at a growth rate equal to or higher than 80% of the maximum growth rate at the growth temperature.

According to the present invention, it is preferred that a vapor growth is performed in a condition that 80% or more of the surface of the silicon single crystal thin film is covered by a decomposition product(s) from silicon chloride raw material. As silicon chloride, for example, tetrachlorosilane ($SiCl_4$), trichlorosilane ($SiHCl_3$) or dichlorosilane ($SiH_2Cl_2$) is used. In each of the cases, a decomposition product(s) of silicon chloride, which covers the surface of the thin film, is $SiCl$ and/or $SiCl_2$.

Coverage proportion by $SiCl$ and/or $SiCl_2$ on the surface of a thin film is different from apparatus to apparatus, even though set points for a concentration of a raw material in a process gas and a growth temperature are the same. However, the mechanism of chemical reactions occurring on a surface of a single crystal in any apparatus is the same. Therefore, in the case of trichlorosilane, for example, supply rates of $SiHCl_3$ and $H_2$ are respectively determined by following a relation expressed by the equation (1) at a growth temperature of 800° C. to 1200° C., so that a coverage proportion $\phi$ by decomposition products of silicon chloride, for example $SiCl$ and/or $SiCl_2$, on the surface of the thin film is 0.8 or higher;

$$[SiHCl_3]/[H_2] = \phi Kr/(1-\phi)Kad \quad (1)$$

wherein Kad is an adsorption rate constant of trichlorosilane on a surface of a single crystal and Kr is a growth rate constant of Si on a surface of a single crystal, and Kad and Kr are expressed as follows;

$$Kad = 2.72 \times 10^6 \exp(-1.72 \times 10^5/RT)$$

$$Kr = 5.63 \times 10^3 \exp(-1.80 \times 10^5/RT)$$

wherein $[SiHCl_3]$ and $[H_2]$ are respectively molar concentrations (mol/m$^3$) of $SiHCl_3$ and $H_2$ on the surface of the single crystal, a $[SiHCl_3]/[H_2]$ ratio is essentially equal to a ratio of supplied molar concentrations of both materials, R is an ideal gas constant (J/mol·K) and T is a gas temperature (K).

The above equation (1) is derived from an assumption of a model that molecules of silicon chloride are in the first place adsorbed on a surface of a silicon single crystal and subsequently silicon atoms are formed to be as a thin film through a chemical reaction with hydrogen.

An adsorption rate Vad of trichlorosilane, for example, as a silicon chloride raw material for adsorbing on a surface of a silicon single crystal is proportional to an uncovered proportion (1-$\phi$) of the surface by trichlorosilane and to a molar concentration of trichlorosilane $[SiHCl_3]$ present in the vicinity of the surface, which relation can be expressed in the following equation;

$$Vad = Kad(1-\phi)[SiHCl_3]$$

A reaction rate Vr of trichlorosilane with hydrogen to produce silicon by a chemical reaction is proportional to a coverage proportion $\phi$ by trichlorosilane on the surface and to a molar concentration $[H_2]$ of hydrogen, which relation is expressed in the following equation;

$$Vr = Kr\phi[H_2]$$

When a growth rate is large enough by an abundant supply of trichlorosilane as raw material, a reaction rate Vr to produce silicon and an adsorption rate Vad of trichlorosilane to be adsorbed on a surface of a silicon single crystal is equal, so that the following equation is established;

$$Vr = Vad \quad (2)$$

The equation (2) gives the equation (1) with respect to $[SiHCl_3]/[H_2]$ as its solution.

In the case of, for example, $[SiHCl_3]/[H_2] = 0.004$ at a growth temperature between 800° C. and 1200° C., a growth rate of a thin film is equal to or higher than 80% of the maximum growth rate and a coverage proportion $\phi$ by trichlorosilane is more than 80% of the total surface and thereby a smooth surface of silicon single crystal can be obtained.

BRIEF DESCRIPTION OF THE DRAWINGS

The novel features which are considered characteristic of the present invention are set forth with particularity in the appended claims. The present invention itself, however, and additional objects and advantages thereof will best be understood from the following description of embodiments thereof when read in connection with the accompanying drawings, in which:

DETAILED DESCRIPTION OF THE INVENTION

Below, description will be given to the present invention by way of examples,

EXAMPLE 1

Example 1 shows a relation between concentrations of a raw material gas at the gas supply port of a production apparatus and growth rates.

Figure 2:
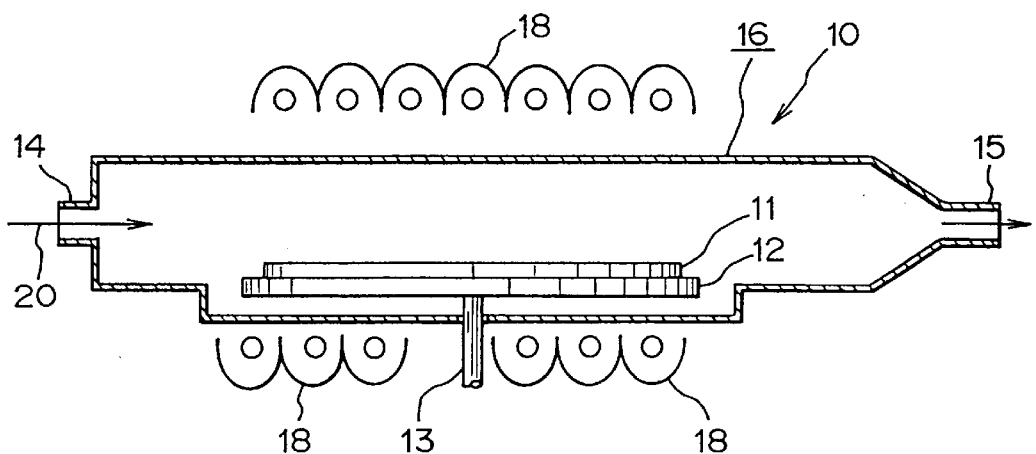
FIG. 2 is a schematic view illustrating an example of the vapor growth apparatus.

Trichlorosilane ($SiHCd_3$) a s a raw material was mixed with hydrogen gas (a carrier gas) flowing at a constant flow rate and was fed as a process gas into a quartz glass vessel 16 prepared in a vapor growth apparatus shown in FIG. 2. A silicon single crystal substrate 11 of 200 mm in diameter placed on a susceptor 12 inside the quartz glass vessel 16 was heated by a radiation heating means 18.

Figure 1:
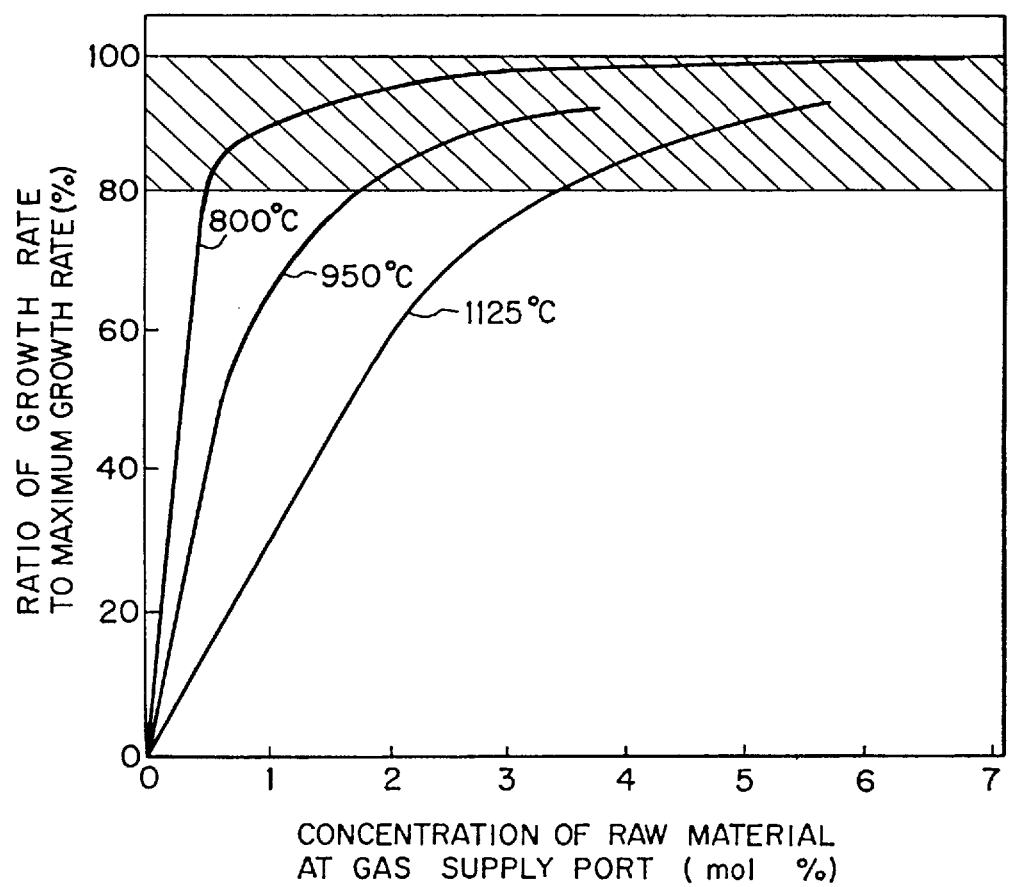
FIG. 1 is a graph showing a relationship between concentrations of raw material at the gas supply port of a vapor growth apparatus and ratio of growth rates of a thin film on a single crystal.
Figure 3:
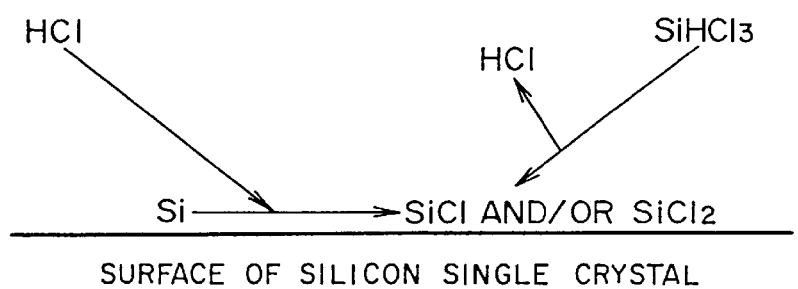
FIG. 3 is a view illustrating an essential aspect of a model for a chemical reaction occurring in a growth of a thin film on a surface of silicon single crystal.

In cases that silicon single crystal substrates were respectively heated at 800° C., 950° C. and 1125° C., in which conditions a chemical reaction according to a model shown in FIG. 3 is conducted, relative growth rates in percentage in reference to the maximum growth rate being set as 100% at each growth temperature were plotted as a function of the concentrations (mol %) of a raw material gas at the supply port 14 in a graph. The results are shown in the graph of FIG. 1.

Here, the maximum growth rate at each growth temperature is defined as a growth rate when the increase of the growth rate substantially ceases at the growth temperature while a concentration of a raw material gas is still increased. As seen in FIG. 1, a growth rate at a growth temperature is increased as a concentration of a raw material gas increases. In a traditional way of vapor phase growth, a growth rate has been selected from a region of low concentrations of a raw material gas, where a growth rate is increased in a linear relationship with a concentration of the raw material gas, and thereby a desired concentration of the raw material gas is set with ease.

On the other hand, in the region of high concentrations where a growth rate is equal to or exceeds a value of 80% of the maximum growth rate at a growth temperature, an increasing rate of the growth rate slows down gradually or shows virtually no increase while the concentration of the raw material gas increases. The region of high concentrations has not been utilized for production because of a great amount of necessary consumption of the raw material.

Silicon single crystal thin films of 1 $\mu$m to 10 $\mu$m thickness were grown in the conditions of the example 1 and each surface of the thin films was measured with a surface-roughness measuring instrument using scattering of laser light. It was found that a smooth surface was obtained in a stable manner in a region of high concentrations where a growth rate is equal to or higher than 80% of the maximum growth rate. It was also confirmed that a surface roughness of a thin film became more conspicuously worsened as a growth rate was lessened from 80% of the maximum growth rate downward.

A growth rate is proportional to a molar concentration of hydrogen and to a coverage proportion by decomposition products from silicon chloride such as trichlorosilane. More particularly, when a growth rate is equal to or higher than 80% of the maximum growth rate at given growth conditions, a coverage proportion by decomposition products from silicon chloride raw material becomes 80% or higher. When a molar concentration ratio of silicon chloride raw material to hydrogen is so set that a coverage proportion φ by silicon chloride is 0.8 or higher, a growth rate becomes equal to or exceeds 80% of the maximum growth rate, and a smooth surface of the thin film is obtained in a stable manner.

Example 2 shows a relation between a ratio of a growth rate to the maximum growth rate and a surface roughness of a silicon single crystal thin film.

In the example 2, experiments were conducted on 25 substrates of 100 mm to 200 mm in diameter at a growth temperature in the range of 800° C. to 1150° C. for growing thin films of 1 μm to 10 μm thick.

Figure 4:
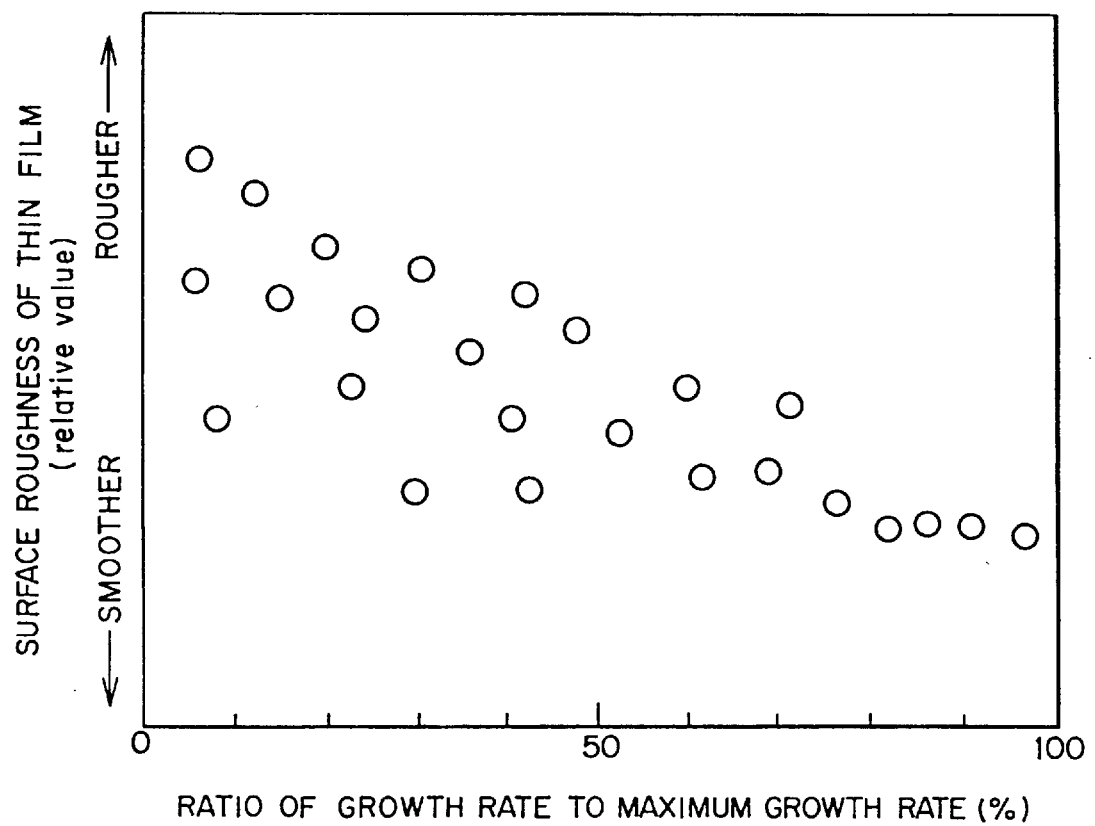
FIG. 4 is a graph showing a relation ship between ratios of growth rates to the maximum growth rate and surface roughnesses of silicon single crystal.

Silicon single crystal thin films were grown on the above substrates by using the above growth conditions under the conditions as those used in the example 1. Surface roughness of the thin films were measured with a surface-roughness measuring instrument using scattering of laser light and results are shown in FIG. 4. As seen in FIG. 4, thin films each having a smooth surface were obtained in a stable manner in the region of the growth rate equal to or higher than 80% of the maximum growth rate.

In the foregoing examples, trichlorosilane ($SiHCl_3$) was used as silicon chloride raw material, but other silicon chlorides such as tetrachlorosilane ($SiCl_4$) and dichlorosilane ($SiH_2Cl_2$) can be also used in a method according to the present invention in a similar way as silicon chloride raw material in either of the examples 1 and 2.

As described above, according to the present invention, a silicon single crystal thin film with a smooth surface can be advantageously obtained in a stable manner by controlling a growth rate of a thin film so as to be equal to or higher than 80% of the maximum growth rate at the growth temperature.

We claim:

1. A method of producing a silicon single crystal thin film on a semiconductor single crystal substrate by vapor-phase growth, comprising the steps of:

mixing trichlorosilane with $H_2$ gas to form a process gas; and supplying the process gas to a semiconductor single crystal substrate which is at a growth temperature, wherein supply rates of the trichlorosilane and $H_2$ gas are determined by the following equation (1) at a growth temperature range of 800° C. to 1200° C., so that a coverage proportion φ by SiCl and/or $SiCl_2$ as decomposition products from the trichlorosilane on the surface of the silicon single crystal thin film is at least 0.8, wherein $$[SiHCl_3]/[H_2] = \phi Kr/(1-\phi) \, Kad, \tag{1}$$

$$Kad = 2.72 \times 10^6 \exp(-1.72 \times 10^5/RT),$$

$$Kr = 5.63 \times 10^3 \exp(-1.80 \times 10^5/RT),$$

wherein:

Kad is an adsorption rate constant of trichlorosilane on a surface of a single crystal, Kr is a growth rate constant of Si on the surface of the single crystal,

[$SiHCl_3$] and [$H_2$] are molar concentrations (mol/m³) of $SiHCl_3$ and $H_2$, respectively, on the surface of the single crystal, R is the ideal gas constant (J/mol.K), and T is the gas temperature (K); and the silicon single crystal thin film is grown on the silicon single crystal substrate at a growth rate equal to at least 80% of the maximum growth rate of the silicon single crystal thin film at the growth temperature.

2. A method of producing a silicon single crystal thin film on a semiconductor single crystal substrate by vapor-phase growth, comprising the steps of:

mixing silicon chloride raw material with hydrogen $H_2$ gas to form a process gas; and supplying the process gas to a semiconductor single crystal substrate at a growth temperature, wherein an assumption of a model is conceived that molecules of silicon chloride raw material are in the first place adsorbed on a surface of a silicon single crystal and subsequently silicon atoms are formed as a thin film through a chemical reaction between the silicon chloride raw material and hydrogen and with adoption of the assumption, supply rates of the silicon chloride raw material and $H_2$ are respectively determined so that a coverage proportion φ by the silicon chloride raw material on the surface of the thin film is 0.8 or higher in the model and the silicon single crystal thin film is grown in a vapor-phase by supplying the silicon chloride raw material and hydrogen gas at the supply rates thereof determined by the model.

3. A method of producing a silicon single crystal thin film according to claim 2, wherein the silicon chloride raw material is trichlorosilane, and the supply rates of trichlorosilane and hydrogen in the process gas are determined by the following equation (1) at a growth temperature range of from 800° C. to 1200° C., $$[SiHCl_3]/[H_2] = \phi Kr/(1-\phi) \, Kad, \tag{1}$$

$$Kad = 2.72 \times 10^6 \exp(-1.72 \times 10^5/RT),$$

$$Kr = 5.63 \times 10^3 \exp(-1.80 \times 10^5/RT),$$

wherein:

Kad is an adsorption rate constant of trichlorosilane on a surface of a single crystal, Kr is a growth rate constant of Si on the surface of the single crystal,

[$SiHCl_3$] and [$H_2$] are respectively molar concentrations (mol/m³) of $SiHCl_3$ and $H_2$ on the surface of the single crystal, R is an ideal gas constant (J/mol.K), and T is a gas temperature (K).

4. A method of producing a silicon single crystal thin film according to claim 3, wherein the growth temperature is from 800° C. to 1125° C.

5. A method of producing a silicon single crystal thin film according to claim 3, wherein the ratio [$SiHCl_3$]/[$H_2$] equals 0.004.

* * * * *